(12) United States Patent
Sugita et al.

(10) Patent No.: US 12,372,997 B2
(45) Date of Patent: Jul. 29, 2025

(54) PROCESSING DEVICE AND ERROR DETECTION METHOD

(71) Applicant: Hitachi Information & Telecommunication Engineering, Ltd., Yokohama (JP)

(72) Inventors: Kenichi Sugita, Yokohama (JP); Hideyuki Oguri, Yokohama (JP); Takao Yamauchi, Yokohama (JP); Hiroki Mizosoe, Yokohama (JP)

(73) Assignee: HITACHI INFORMATION AND TELECOMMUNICATION ENGINEERING, LTD., Kanagawa (JP)

( * ) Notice: Subject to any disclaimer, the term of this patent is extended or adjusted under 35 U.S.C. 154(b) by 0 days.

(21) Appl. No.: 18/033,574

(22) PCT Filed: Mar. 14, 2022

(86) PCT No.: PCT/JP2022/011402
§ 371 (c)(1),
(2) Date: Apr. 25, 2023

(87) PCT Pub. No.: WO2023/175685
PCT Pub. Date: Sep. 21, 2023

(65) Prior Publication Data
US 2024/0377854 A1    Nov. 14, 2024

(51) Int. Cl.
*G06F 1/10* (2006.01)
*G06F 1/12* (2006.01)

(52) U.S. Cl.
CPC . *G06F 1/10* (2013.01); *G06F 1/12* (2013.01)

(58) Field of Classification Search
None
See application file for complete search history.

(56) References Cited

U.S. PATENT DOCUMENTS 9,225,507 B1 * 12/2015 Lye .............. H03L 7/235
10,936,003 B1 * 3/2021 Wu .............. G11B 20/10055
(Continued)

FOREIGN PATENT DOCUMENTS

JP    10-020961 A    6/1996
JP    H08163110 A    6/1996
(Continued)

OTHER PUBLICATIONS

International Search Report, PCT/JP2022/011402, May 10, 2022, 2 pgs. (JP only).
(Continued)

*Primary Examiner* — Jeffrey S Zweizig
(74) *Attorney, Agent, or Firm* — Volpe Koenig

(57) ABSTRACT

A processing device comprises: operation circuits that operate based on a clock signal supplied from a clock generation circuit; a distribution circuit that branches the clock signal and outputs branched clock signals to the operation circuits; and a detection circuit that compares outputs of the operation circuits and detects an error. At least one of the operation circuits is coupled to the distribution circuit via at least one conversion circuit that converts the clock signal into a clock signal capable of detecting an abnormality in the clock signal when an abnormality occurs in the clock signal.

9 Claims, 3 Drawing Sheets

(56) References Cited

U.S. PATENT DOCUMENTS

| | | | |
|---|---|---|---|
| 11,500,412 B2* | 11/2022 | Chromczak | H01L 24/14 |
| 2001/0040472 A1 | 11/2001 | Suga et al. | |
| 2010/0237914 A1* | 9/2010 | Katoh | H03L 7/091 |
| | | | 327/149 |
| 2017/0041006 A1 | 2/2017 | Uezato | |

FOREIGN PATENT DOCUMENTS

| | | | |
|---|---|---|---|
| JP | 2001-313547 A | 11/2001 |
| JP | 2006-287736 A | 10/2006 |
| JP | 2017-033325 A | 2/2017 |

OTHER PUBLICATIONS

Office Action issued on Jul. 9, 2024 for Japanese Patent Application No. 2023-510451.

* cited by examiner

PROCESSING DEVICE AND ERROR DETECTION METHOD

TECHNICAL FIELD

The present invention relates to a processing device that includes multiplexed operation units and detects errors by comparing the operation results from the operation units.

BACKGROUND ART

From the viewpoint of reliability, safety, and the like, a processing device having multiplexed operation units is known. The operation unit operates according to a clock signal supplied from an external clock generation circuit. A technique described in Japanese Patent Application Publication No. H10-20961 is known as a technique for supplying a normal clock signal to multiplexed operation units.

According to the technique disclosed in Japanese Patent Application Publication No. H10-20961, the frequencies of clock signal sources of a plurality of oscillators 1-1 to 1-N are divided by frequency dividers 22-1 to 22-N, and comparators 25-1 to 25-N compare the count values of counters 24-1 to 24-N, and a normal clock signal is selected and sent according to the comparison result. The comparison of the clock signals is automatically performed in a predetermined period under the control of a comparison timing control unit 21, and an R/W control unit 26 reads the count value according to an external command so that the comparison can be performed at any period. Thus, the comparison result can be reflected in the control of a selector 28 by a selector control unit 27.

CITATION LIST

Patent Literature

[patent literature1] Japanese Patent Application Publication No. H10-20961

SUMMARY OF THE INVENTION

Technical Problem

Even if the conventional technique such as Japanese Patent Application Publication No. H10-20961 is used, an abnormality may occur in the clock signal. In this case, an error occurs due to an abnormality in the clock signal, but the conventional technique can not detect this error.

The present invention is to implement a processing device capable of detecting an error caused by an abnormality in a clock signal.

Solution to Problem

A representative example of the present invention disclosed in this specification is as follows: a processing device comprises: a plurality of operation circuits that operate based on a clock signal supplied from a clock generation circuit; a distribution circuit that branches the clock signal and outputs branched clock signals to the plurality of operation circuits; and a detection circuit that compares outputs of the plurality of operation circuits and detects an error. At least one of the plurality of operation circuits is coupled to the distribution circuit via at least one conversion circuit that converts the clock signal into a clock signal capable of detecting an abnormality in the clock signal when an abnormality occurs in the clock signal.

Advantageous Effects of Invention

According to the present invention, the processing device can detect an error caused by an abnormality in a clock signal by using a simple circuit configuration.

BRIEF DESCRIPTION OF THE DRAWINGS

The present invention can be appreciated by the description which follows in conjunction with the following figures, wherein.

DETAILED DESCRIPTION OF INVENTION

Figure 1:
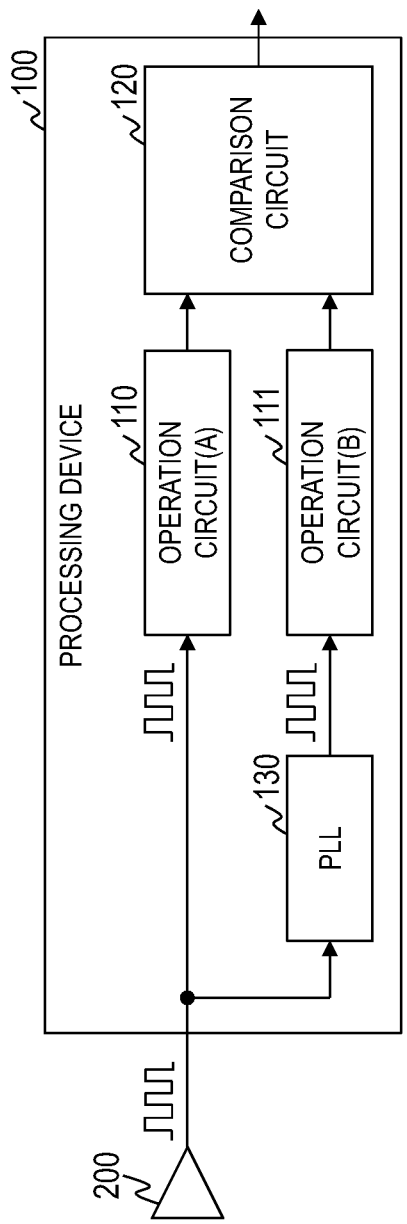
FIG. 1 is a block diagram showing a configuration example of a processing device according to a first embodiment.

Now, a description is given of an embodiment of this invention referring to the drawings. It should be noted that this invention is not to be construed by limiting the invention to the content described in the following embodiment. A person skilled in the art would easily recognize that a specific configuration described in the following embodiment may be changed within the scope of the concept and the gist of this invention.

In a configuration of this invention described below, the same or similar components or functions are assigned with the same reference numerals, and a redundant description thereof is omitted here.

Notations of, for example, "first", "second", and "third" herein are assigned to distinguish between components, and do not necessarily limit the number or order of those components.

The position, size, shape, range, and others of each component illustrated in, for example, the drawings may not represent the actual position, size, shape, range, and other metrics in order to facilitate understanding of this invention. Thus, this invention is not limited to the position, size, shape, range, and others described in, for example, the drawings.

First Embodiment

FIG. 1 is a block diagram showing a configuration example of a processing device according to a first embodiment.

A processing device 100 includes two operation circuits 110 and 111, a comparison circuit 120 and a phase locked loop (PLL) 130. A clock signal is supplied to the processing device 100 from a clock generation circuit 200.

Each of the operation circuits 110 and 111 is a circuit that perform operation operations based on clock signals. The operation circuits 110 and 111 are, for example, central processing units (CPUs) and field programmable gate arrays (FPGAs).

The comparison circuit 120 compares the operation results from the operation circuits 110 and 111 and outputs an operation result or an error signal based on the comparison result. Specifically, the comparison circuit 120 outputs the operation result when there is no difference between the two operation results, and the comparison circuit 120 outputs an error signal when the two operation results are different.

The PLL 130 performs phase synchronization processing on the clock signal. The PLL 130 functions as a conversion circuit that converts the clock signal into a clock signal capable of detecting an abnormality in the clock signal when an abnormality occurs in the clock signal. The PLL 130 of the first embodiment does not perform frequency division or multiplication, and outputs a clock signal having the same frequency as that of the input clock signal.

A clock signal supplied from the clock generation circuit 200 is first branched into a first clock signal and a second clock signal by a distribution circuit (not shown). The first clock signal is input to the operation circuit 110. The second clock signal is input to the PLL 130 and the operation circuit 111 in this order.

When an abnormality such as noise occurs in the clock signal supplied from the clock generation circuit 200, the noise or the like is removed by the phase synchronization processing executed by the PLL 130, and the periodicity of the waveform indicating the abnormality appearing in the clock signal changes. Therefore, a difference appears between the first clock signal and the clock signal output from the PLL 130, and a difference also appears between the operation results from the operation circuits 110 and 111. As a result, the comparison circuit 120 can detect an error caused by an abnormality in the clock signal.

According to the first embodiment, it is possible to realize the processing device 100 capable of detecting an error caused by an abnormality in the clock signal by using a simple circuit configuration. Since the circuit configuration is simple, an increase in the manufacturing cost of the processing device 100 can be suppressed, and an increase in the failure probability of the processing device 100 due to an increase in the number of circuits can be suppressed.

Note that errors can be detected with a similar configuration even when the processing device 100 is a CPU, an FPGA, or the like. In this case, the operation circuit becomes an arithmetic core. In addition, the processing device 100 may be composed of two boards on which operation circuits are mounted.

The circuit is not limited to the PLL, and may be any circuit capable of realizing a function of converting the clock signal into a signal capable of detecting an abnormality when an abnormality occurs in the clock signal.

In the first embodiment, a dual modular redundancy (DMR) system has been described as an example, and a triple modular redundancy (TMR) system has the same effect. In the case of a TMR system, the comparison circuit 120 would be a majority circuit. In addition, two of the branched clock signals are input to the PLL. If the operation results using the clock signals output from the PLLs are the same and the operation results using the branched clock signals are different, it is detected as an error caused by an abnormality in the clock signal.

Second Embodiment

Figure 2:
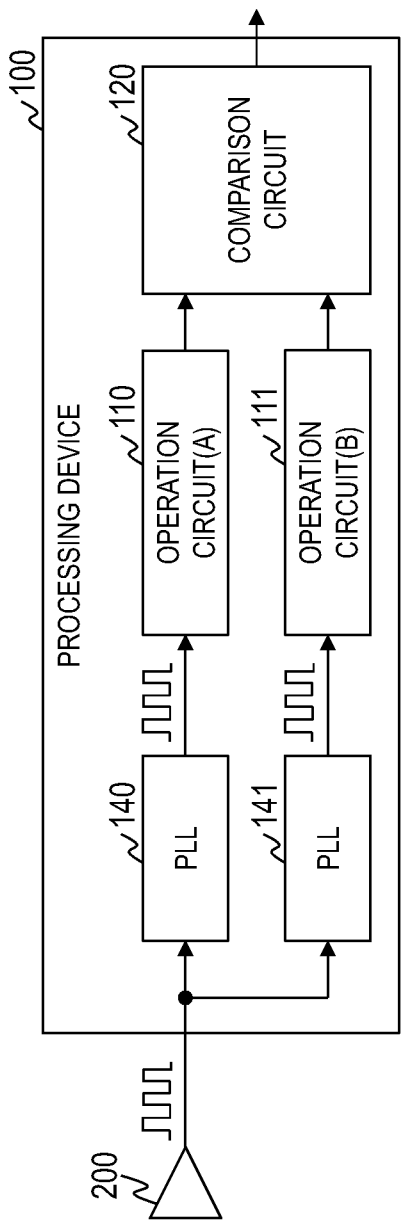
FIG. 2 is a block diagram illustrating a configuration example of a processing device according to a second embodiment.

FIG. 2 is a block diagram illustrating a configuration example of a processing device according to a second embodiment.

The processing device 100 includes two operation circuits 110 and 111, a comparison circuit 120, and two PLLs 140 and 141. A clock signal is supplied to the processing device 100 from a clock generation circuit 200.

The PLL 140 executes phase synchronization processing including processing (frequency division) for converting the frequency of the input clock signal into 1/N. The PLL 141 performs phase synchronization processing including processing (frequency division) for converting the frequency of the input clock signal into 1/N and processing for generating a delay of M cycles. Here, N and M are integers of 1 or more.

First, a clock signal supplied from the clock generation circuit 200 is branched into a first clock signal and a second clock signal by a distribution circuit (not shown). The first clock signal is input to the PLL 140 and the operation circuit 110 in this order. The second clock signal is input to the PLL 141 and the operation circuit 111 in this order.

If an abnormality such as noise occurs in the clock signal supplied from the clock generation circuit 200, the noise or the like is removed by phase synchronization processing executed by the PLLs 140 and 141. In addition, the delay in the PLL 141 changes the periodicity of the waveform indicating an abnormality appearing in the clock signal. Therefore, a difference appears between the clock signal output from the PLL 140 and the clock signal output from the PLL 141, and a difference also appears between the operation results from the operation circuits 110 and 111. As a result, the comparison circuit 120 can detect an error caused by an abnormality in the clock signal.

The processing device 100 according to the second embodiment can also achieve the same effect as the first embodiment.

The circuit is not limited to the PLL, and may be any circuit capable of realizing a function of converting the clock signal into a signal capable of detecting an abnormality when an abnormality occurs in the clock signal. For example, a counter or the like may be used.

In the second embodiment, a dual modular redundancy (DMR) system has been described as an example, and a triple modular redundancy (TMR) system has the same effect. In the case of a TMR system, the comparison circuit 120 would be a majority circuit. The branched clock signals are input to PLLs with different division ratios. In addition, the two PLLs generate delays in different cycles. If all the operation results are different, it is detected as an error caused by an abnormality in the clock signal.

Third Embodiment

Figure 3:
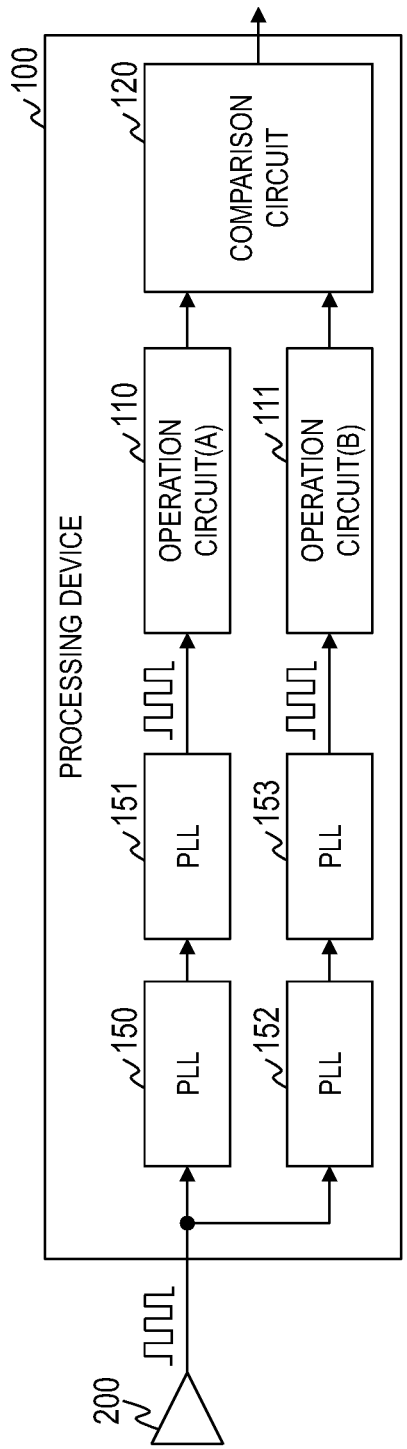
FIG. 3 is a block diagram showing a configuration example of a processing device according to a third embodiment.

FIG. 3 is a block diagram showing a configuration example of a processing device according to the third embodiment.

The processing device 100 includes two operation circuits 110 and 111, a comparison circuit 120, and four PLLs 150, 151, 152, and 153. A clock signal is supplied to the processing device 100 from a clock generation circuit 200.

The PLL 150 executes phase synchronization processing including processing (frequency multiplication) for converting the frequency of the input clock signal into M times. The PLL 151 executes phase synchronization processing including processing (frequency division) for converting the frequency of the input clock signal into 1/M. The PLL 152 executes phase synchronization processing including processing (frequency multiplication) for converting the frequency of the input clock signal into N times. The PLL 153 executes phase synchronization processing including processing (frequency division) for converting the frequency of the input clock signal into 1/N. Here, N and M are integers of 1 or more. It is also assumed that N and M are different values.

First, a clock signal supplied from the clock generation circuit 200 is branched into a first clock signal and a second clock signal by a distribution circuit (not shown). The first clock signal is input to the PLL 150, the PLL 151, and the operation circuit 110 in this order. The second clock signal is input to the PLL 152, the PLL 153, and the operation circuit 111 in this order.

If there is an abnormality such as noise in the clock signal supplied from the clock generation circuit 200, the noise or the like is removed by phase synchronization processing executed by the PLLs 150, 151, 152, and 153. In addition, since there is a difference in the internal processing in the phase synchronization processing executed by the PLLs 150 and 151 and the PLLs 152 and 153, although the clock signal output from the PLL 151 and the clock signal output from the PLL 153 are apparently the same clock signal, the periodicity of the waveform that indicates an abnormality appearing in the clock signal changes. Therefore, a difference appears between the clock signal output from the PLL 151 and the clock signal output from the PLL 153, and a difference also appears between the operation results from the operation circuits 110 and 111. As a result, the comparison circuit 120 can detect an error caused by an abnormality in the clock signal.

The processing device 100 of the third embodiment can also achieve the same effect as the first embodiment.

The circuit is not limited to the PLL, and may be any circuit capable of realizing a function of converting the clock signal into a signal capable of detecting an abnormality when an abnormality occurs in the clock signal. For example, the PLLs 151 and 153 may be counters or the like.

In the third embodiment, a dual modular redundancy (DMR) system has been described as an example, and a triple modular redundancy (TMR) system has the same effect. In the case of a TMR system, the comparison circuit 120 would be a majority circuit. Further, the branched clock signals are input to PLLs with different multiplication rates and PLLs with different frequency division ratios. If all the operation results are different, it is detected as an error caused by an abnormality in the clock signal.

The followings are the representative aspects of the invention other than those described in the claims.

(1) A processing device comprising: a first operation circuit and a second operation circuit that operate based on a clock signal supplied from a clock generation circuit; a distribution circuit that branches the clock signal and outputs the branched clock signals the first operation circuit and the second operation circuit; and a comparison circuit that compares outputs of the first operation circuit and the second operation circuit and detects an error, wherein the distribution circuit and the first operation circuit are coupled via at least one conversion circuit that converts the clock signal into a clock signal capable of detecting an abnormality in the clock signal when an abnormality occurs in the clock signal.

(2) The processing device according to (1), wherein the distribution circuit and the second operation circuit are coupled via the at least one conversion circuit.

(3) The processing device according to (2), wherein the at least one conversion circuit that couples the distribution circuit and the first operation circuit includes a first conversion circuit, the at least one conversion circuit that couples the distribution circuit and the second operation circuit includes a second conversion circuit, the first conversion circuit converts a frequency of the clock signal into a reciprocal of a first integer, the second conversion circuit converts the frequency of the clock signal into a reciprocal of the first integer and generates a delay of second integer cycles.

(4) The processing device according to (2), wherein the at least one conversion circuit that couples the distribution circuit and the first operation circuit includes a first conversion circuit and a second conversion circuit, the at least one conversion circuit that couples the distribution circuit and the second operation circuit includes a third conversion circuit and a fourth conversion circuit, the first conversion circuit converts the frequency of the clock signal into a first integer multiple and outputs the clock signal to the second conversion circuit, the second conversion circuit converts the frequency of the clock signal output from the first conversion circuit into a reciprocal of the first integer and outputs the clock signal to the first operation circuit, the third conversion circuit converts the frequency of the clock signal into a second integer multiple and outputs the clock signal to the fourth conversion circuit, and the fourth conversion circuit converts the frequency of the clock signal output from the third conversion circuit into a reciprocal of the second integer and outputs the clock signal to the second operation circuit.

(5) The processing device according to any one of (1) to (4), wherein the conversion circuit is a phase synchronization circuit.

In addition, the present invention is not limited to the above-described embodiments, and includes various modifications. The above-described embodiments have been described in detail in order to explain the present invention in an easy-to-understand manner, and are not necessarily limited to those having all the described configurations. In addition, it is possible to replace a portion of the configuration of a certain embodiment with the configuration of another embodiment, and it is also possible to add the configuration of another embodiment to the configuration of a certain embodiment. Moreover, addition, deletion, or replacement of another configuration may be conducted with respect to a portion of the configuration of each embodiment.

What is claimed is:

1. A processing device comprising:
a plurality of operation circuits, each operation circuit comprising a central processing unit (CPU) or an arithmetic core, that operate based on a clock signal supplied from a clock generation circuit;
a distribution circuit that branches the clock signal and outputs branched clock signals to the plurality of operation circuits; and
a detection circuit that compares outputs of the plurality of operation circuits and detects an error,
at least one of the plurality of operation circuits being coupled to the distribution circuit via at least one conversion circuit that converts the clock signal into a clock signal capable of detecting an abnormality in the clock signal when an abnormality occurs in the clock signal.

2. The processing device according to claim 1, comprising a plurality of conversion circuits, wherein each of the plurality of operation circuits is coupled to the distribution circuit via a respective one of the plurality of conversion circuits.

3. The processing device according to claim 2, wherein the plurality of operation circuits include a first operation circuit, the first operation circuit is coupled to a respective one of the plurality of conversion circuits that divides a frequency of the clock signal, the plurality of operation circuits other than the first operation circuit are coupled to one conversion circuit that divides the frequency of the clock signal and generates a delay, frequency division ratios of each of the plurality of conversion circuits each coupled to one of the plurality of operation circuits are different, and delay cycles of each of the plurality conversion circuits each coupled to one of the plurality of operation circuits other than the first operation circuit are different.

4. The processing device according to claim 2, wherein each of the plurality of conversion circuits comprises a first conversion circuit configured to divide a respective frequency of a respective clock signal and a second conversion circuit configured to multiply the respective frequency of the respective clock signal and wherein each of the plurality of operation circuits is coupled to a respective one first conversion circuit and a respective one second conversion circuit, frequency division ratios of each of a plurality of first conversion circuits each coupled to one of the plurality of operation circuits are different, and multiplication rates of each of a plurality of second conversion circuits each coupled to one of the plurality of operation circuits are different.

5. The processing device according to claim 1, wherein the at least one conversion circuit is a phase synchronization circuit.

6. An error detection method performed by a processing device, comprising:

a first step of branching, by the processing device, a clock signal supplied from a clock generation circuit;

a second step of converting, by the processing device, at least one of a branching clock signals into a clock signal capable of detecting an abnormality in the clock signal when an abnormality occurs in the clock signal;

a third step of performing, by the processing device, processing operations or arithmetic operations in parallel based on the branched clock signals; and a fourth step of comparing, by the processing device, execution results of the processing operations or arithmetic operations executed in parallel and detecting an error.

7. The error detection method according to claim 6, wherein the second step includes a step of executing, by the processing device, phase synchronization processing on one of the branched clock signals.

8. The error detection method according to claim 6, wherein the second step includes a step of executing, by the processing device, phase synchronization processing on each of the branched clock signals;

the phase synchronization processing executed for the at least one of the branched clock signals includes delay processing.

9. The error detection method according to claim 6, wherein the second step includes a step of executing, by the processing device, phase synchronization processing on the branched clock signals, and the phase synchronization processing executed for the branched clock signals includes frequency division and multiplication.

\* \* \* \* \*